(12) United States Patent
Hung et al.

(10) Patent No.: US 6,429,451 B1
(45) Date of Patent: Aug. 6, 2002

(54) REDUCTION OF AMBIENT-LIGHT-REFLECTION IN ORGANIC LIGHT-EMITTING DEVICES

(75) Inventors: Liang-Sun Hung, Kowloon (HK); Joseph K. Madathil, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/577,092

(22) Filed: May 24, 2000

(51) Int. Cl.[7] .............................................. H01L 51/00
(52) U.S. Cl. .............................. 257/40; 257/10; 257/98
(58) Field of Search .............................. 257/40, 10, 98

(56) References Cited

U.S. PATENT DOCUMENTS

| | | |
|---|---|---|
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |
| 5,047,687 A | 9/1991 | VanSlyke |
| 5,059,862 A | 10/1991 | VanSlyke et al. |
| 5,061,569 A | 10/1991 | VanSlyke et al. |
| 5,776,622 A | 7/1998 | Hung et al. |
| 5,998,232 A * | 12/1999 | Maruska ....................... 438/46 |
| 6,028,327 A * | 2/2000 | Mizoguchi et al. ........... 257/98 |
| 6,166,487 A * | 12/2000 | Negishi et al. ............. 313/495 |
| 6,201,265 B1 * | 3/2001 | Teraguchi ..................... 257/99 |
| 6,274,887 B1 * | 8/2001 | Yamazaki et al. ............ 257/72 |

OTHER PUBLICATIONS

Journal of Military and Aerospace Electronics, vol. 9, No. 6, Jun., 1998.

* cited by examiner

*Primary Examiner*—Eddie Lee
*Assistant Examiner*—N. Drew Richards
(74) *Attorney, Agent, or Firm*—Raymond L. Owens

(57) ABSTRACT

An organic light-emitting device capable of reducing ambient-light reflection from a cathode includes a light-transmissive substrate, a light-transmissive anode, an organic hole-transporting layer, and an organic electron transporting layer. A reflection-reducing structure disposed between the electron-transporting layer and a light-reflective cathode is capable of providing electron injection into the electron-transporting layer and of substantially reducing reflection of ambient-light entering the device.

8 Claims, 10 Drawing Sheets

REDUCTION OF AMBIENT-LIGHT-REFLECTION IN ORGANIC LIGHT-EMITTING DEVICES

CROSS REFERENCE TO RELATED APPLICATIONS

Reference is made to commonly assigned U.S. patent application Ser. No. 09/577,778 filed May 24, 2000 entitled "Low-Voltage Organic Light-Emitting Device" by Liang-Sun Hung, the disclosure of which is incorporated herein by reference.

FIELD OF THE INVENTION

The present invention generally relates to organic light-emitting devices, and in particular to organic light-emitting devices having reduced ambient-light reflection.

BACKGROUND OF THE INVENTION

An organic light-emitting diode, also referred to as an organic electroluminescent (EL) device is constructed in a normal configuration on a light-transmissive substrate through which the light emitted by the device is viewed, and the device structure comprises, in sequence, the light-transmissive substrate, a light-transmissive conductive hole-injecting electrode, an organic hole-transporting layer, an organic light-emitting layer, an organic electron-transporting layer and an electron-injecting electrode consisting of a metal having a work function less than about 4.0 eV. This highly reflective metal electrode helps to improve brightness of emission in that the electron-injecting electrode provides a surface from which internally generated light from the emission layer or from a light-emitting junction is reflected and directed toward the light-transmissive substrate. However, such a metallic electron-injecting electrode also reflects ambient-light entering the device structure through the light-transmissive substrate and the light-transmissive hole-injecting electrode, thereby degrading the visually perceived contrast of the emitted light, as viewed by an observer. In numerous practical applications, it is quite important that an organic light-emitting device can be easily viewed under ambient-lighting conditions ranging from total darkness to full sunlight so that a sufficient reduction is required in reflection of ambient-light from the mirror-like surface of the metal electron-injecting electrode.

In the construction of some inorganic light-emitting devices, one approach to enhanced sunlight readability and reduction of glare has been to incorporate in such an inorganic device an absorbing and dielectric layer between the inorganic phosphor layer and the counter electrode layer. The thickness of the dielectric layer is optimized to create destructive optical interference of the ambient-light, thereby reducing ambient-light reflection. This approach has produced inorganic light-emitting displays having 14% total reflectance, as disclosed in the *Journal of Military and Aerospace Electronics*, Volume 9, No. 6, June, 1998, which describes features of such a device created by Luxell Technologies, Inc.

Another well known approach to reducing glare attributed to ambient-lighting is to use polarizers, particularly circular polarizers, which may be bonded to an outside surface of the light-transmissive substrate. However, the use of polarizers adds significant cost and a polarizer bonded to a substrate is not a part of the integral layer structure of a light-emitting device. Furthermore, polarizers may reduce the emitted light intensity by 60 percent.

Returning to the aforementioned inorganic light-emitting device, such device has a metal-insulator-semiconductor-insulator-metal-thin-film configuration. Therefore, a dielectric and absorbing material can be used between the top metal electrode and the phosphor emission layer for the reduction in reflection of ambient-light from the top electrode.

In contrast to inorganic light-emitting devices, organic EL devices require electron injection into an organic electron-transporting layer, as well as hole injection into an organic hole-transporting layer. Electron-hole recombination at or near a junction between these organic layers results in light emission when the hole-injecting electrode (also referred to as the anode) is biased at a sufficient positive electrical potential with respect to the electron-injecting electrode (also referred to as the cathode).

To provide effective electron injection from the cathode into the organic electron-transporting layer, the cathode must be formed of a metal or of a combination of metals selected to provide a work function of less than 4.0 eV. If the cathode is formed of a metal having a work function greater than 4.0 eV, electron injection from the cathode to the electron transporting layer will be significantly reduced.

Due to the construction and function of organic EL devices, an ambient-light reflection-reducing layer disposed between a reflective cathode and the electron-transporting layer to provide optical absorbance, has to be electrically conductive, provide a work function of less than 4.0 eV, and be formable by deposition techniques which are compatible with organic EL device fabrication so as to minimize deleterious effects such as, for example, radiation damage or undesirable chemical or physical interactions between the reflection-reducing layer and the organic layer or layers.

Thus, the requirements and specifications imposed on an ambient-light reflection-reducing layer useful in organic light-emitting devices are substantially different from and more stringent than, the requirements for such reflection-reducing layer or structure for an inorganic light-emitting device.

SUMMARY OF THE INVENTION

It is an object of the present invention to provide an organic light-emitting device having reduced ambient-light reflection from a cathode.

It is another object of the present invention to provide an organic light-emitting device having reduced ambient-light reflection from a cathode, in which a reflection-reducing layer is formed between the cathode and an organic electron-transporting layer, and of an electrically conductive material having a work function less than 4.0 eV.

It is a further object of the present invention to provide an organic light-emitting device having reduced ambient-light reflection from a cathode, in which a reflection-reducing layer is formed between a bi-layer interfacial structure and the cathode, and of a material selected to be an n-type semiconductor having a work function greater than 4.0 eV. In one aspect, these and other objects of the invention are achieved in an organic light-emitting device having reduced ambient-light reflection from a cathode, comprising:

a) a light-transmissive substrate;

b) a light-transmissive anode disposed over the substrate;

c) an organic hole-transporting layer disposed over the anode;

d) an organic electron-transporting layer disposed over the hole-transporting layer, an interface between the electron-transporting layer and the hole-transporting layer forming a junction capable of emitting light when the device is operative;

e) a reflection-reducing layer disposed over the electron-transporting layer, the reflection-reducing layer formed of an electrically conductive material having a work function less than 4.0 eV and capable of providing electron injection into the electron-transporting layer, the reflection-reducing layer substantially reducing reflection of ambient-light entering the device through the substrate and the anode; and f) a cathode disposed over the reflection-reducing layer, the cathode formed of a light-reflecting metal material.

In another aspect, these and other objects of the invention are achieved in an organic light-emitting device having reduced ambient-light reflection from a cathode, comprising:

a) a light-transmissive substrate;

b) a light-transmissive anode disposed over the substrate;

c) an organic hole-transporting layer disposed over the anode;

d) an organic electron-transporting layer disposed over the hole-transporting layer, an interface between the electron-transporting layer and the hole-transporting layer forming a junction capable of emitting light when the device is operative;

e) a bi-layer interfacial structure disposed over the electron-transporting layer, the bi-layer interfacial structure capable of providing electron injection into the electron-transporting layer;

f) a reflection-reducing layer disposed over the bi-layer interfacial structure, the reflection-reducing layer formed of an n-type semiconductor material having a work function greater than 4.0 eV, the reflection-reducing layer substantially reducing reflection of ambient-light entering the device through the substrate and the anode; and g) a cathode disposed over the reflection-reducing layer, the cathode formed of a light-reflecting metal material.

BRIEF DESCRIPTION OF THE DRAWINGS

FIGS. 1, 2, and 3 are necessarily of a schematic nature, since thicknesses of the individual layers are too thin, and thickness differences of the various elements too great to permit depiction to scale or to permit convenient proportionate scaling.

DETAILED DESCRIPTION OF THE EMBODIMENTS

In order to more fully appreciate the construction and performance of the organic light-emitting devices having reduced ambient-light reflection from a cathode, the prior art organic light-emitting device 100 of FIG. 1 will be described.

Figure 2:
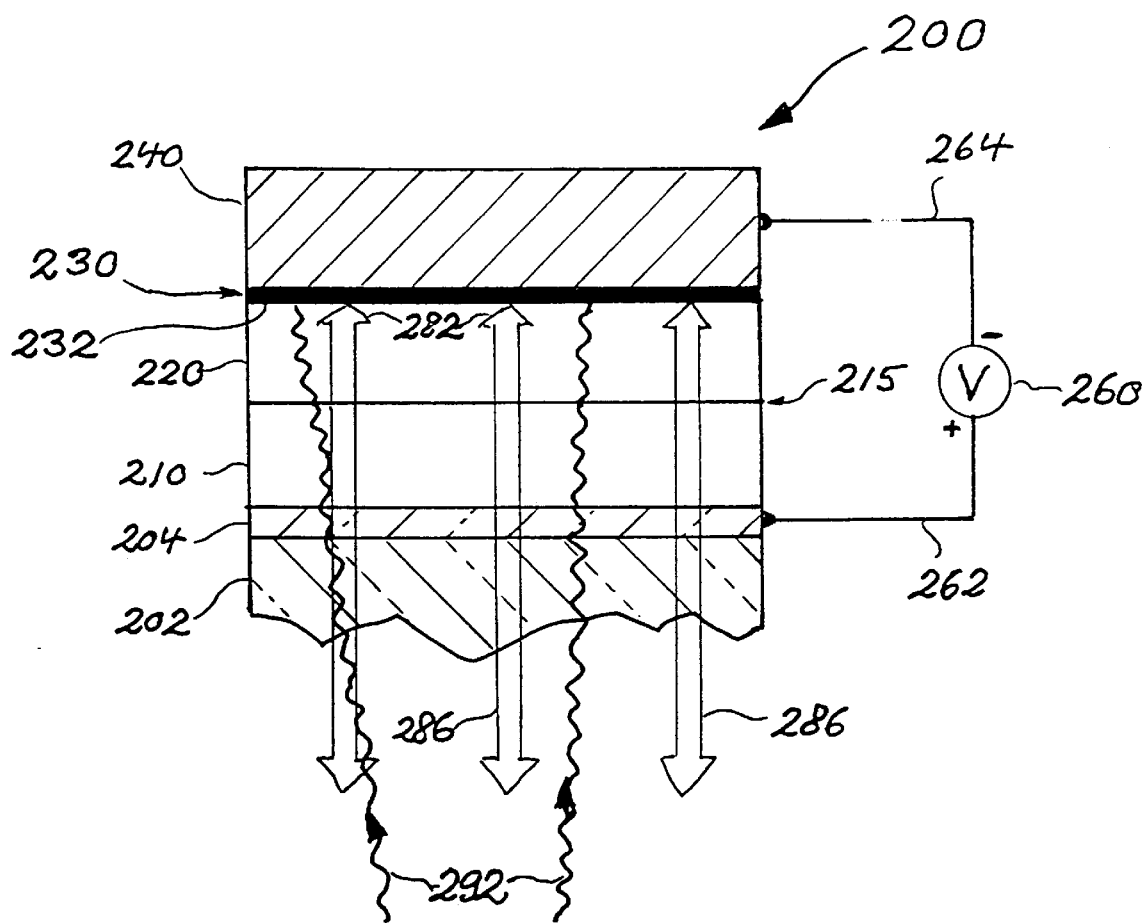
FIG. 2 is a schematic cross section view of one embodiment of an organic light-emitting device constructed in accordance with the present invention, in which a reflection-reducing layer is formed of an electrically conductive material having a work function less than 4.0 eV.
Figure 3:
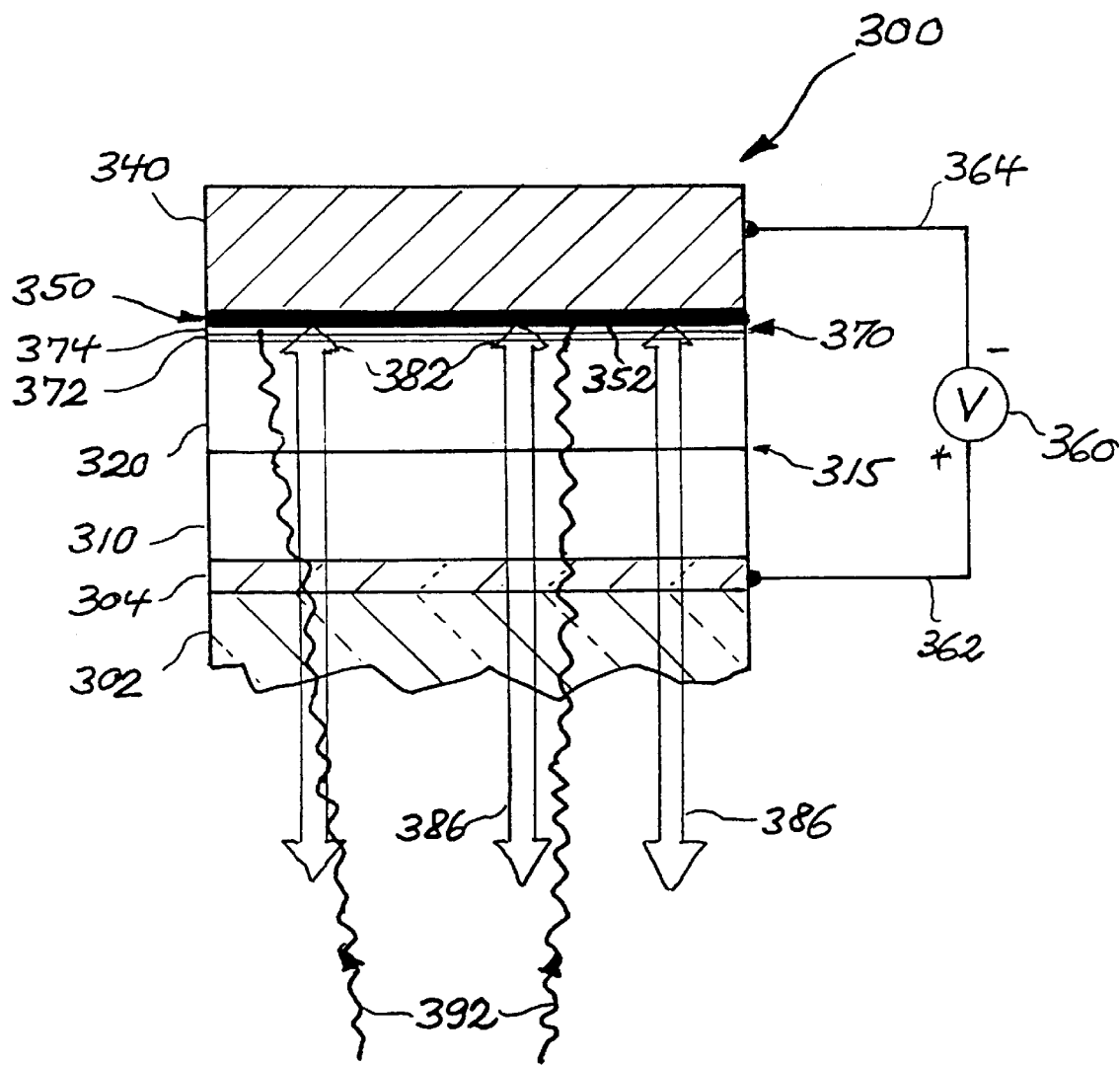
FIG. 3 is a schematic cross section of another embodiment of an organic light-emitting device constructed in accordance with the present invention, in which a reflection-reducing layer is formed of an inorganic n-type semiconductor material having a work function greater than 4.0 eV, and a bi-layer interfacial structure provides electron injection from the reflection-reducing layer into an organic electron-transporting layer.

Like elements and features common to the prior art device and to the inventive devices of FIGS. 2 and 3 have corresponding numeral designations.

Figure 1:
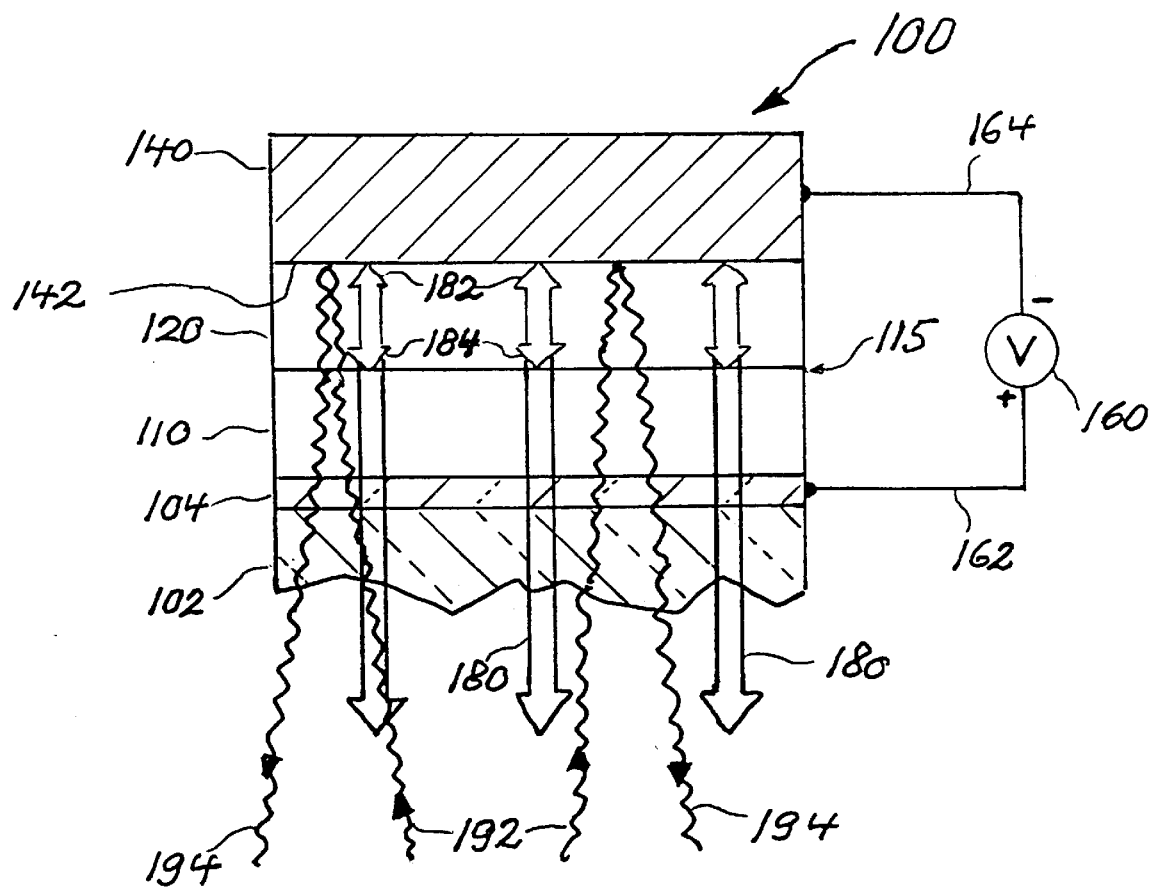
FIG. 1 is a schematic cross section of a prior art organic light-emitting device having a reflective cathode surface from which ambient light as well as light emitted toward the cathode is reflected.

In FIG. 1, an organic light-emitting device 100 has a light-transmissive substrate 102 on which is formed a light-transmissive hole-injecting anode 104. The substrate 102 can be glass or quartz, and the anode 104 is preferably a thin layer of indium tin oxide (ITO) formed over the substrate 102. An organic hole-transporting layer 110 is formed over the anode 104, and an organic electron-transporting layer 120 is formed over the hole-transporting layer 110, and a cathode 140 is formed over the electron-transporting layer 120, and of a material selected to have a work function less than 4.0 eV.

An electrical drive voltage source 160 is connected via a lead 162 to the anode 104, and via a lead 164 to the cathode 140 such that the anode 104 is at a sufficiently more positive electrical potential than the cathode 140. Under these conditions, electrons (negative-charge carriers) will be injected from the cathode 140 into the organic electron-transporting layer 120, and holes (positive charge carriers) will be injected from the anode 104 into the organic hole-transporting layer 110. Electrons and holes are transported through the corresponding organic layers 120 and 110 for recombination at or near a light-emitting junction 115 between these layers, such recombination resulting in light emission from the junction 115. Approximately 50% of the light generated at the junction 115 toward the cathode as light 182 is emitted in a direction toward the cathode 140, and reflected from the reflective cathode surface 142 as light 184. A combination of the reflected light 184 and light emitted from the junction 115 in a direction toward the substrate results in the light 180 emitted through the substrate to an observer.

If the device 100 is viewed under ambient-light conditions ranging from room lighting to bright sunlight, such ambient-light 192 can readily enter the device through the light-transmissive substrate 102 and the light-transmissive anode 104, as indicated by a wavy outline with arrows. This ambient-light 192 entering the device 100 is reflected from the surface 142 of the cathode, shown as reflected ambient-light 194 in wavy outline. It will be appreciated that ambient-light 192 entering the device 100 and reflected ambient-light 194 will degrade the visually perceived contrast of the emitted light 180, as viewed by an observer.

The materials useful in the construction of this prior art organic light-emitting device 100 can be selected from among materials, configurations of layers, and preferred layer thicknesses of conventional organic light-emitting devices such as those described by Tang U.S. Pat. No. 4,356,429; VanSlyke et al. U.S. Pat. No. 4,539,507; VanSlyke et al. U.S. Pat. No. 4,720,432; Tang et al. U.S. Pat. No. 4,885,211; Tang et al. U.S. Pat. No. 4,769,292; VanSlyke et al. U.S. Pat. No. 5,047,687; VanSlyke et al. U.S. Pat. No. 5,059,862; and VanSlyke et al. U.S. Pat. No. 5,061,569, the disclosures of which are herein incorporated by reference.

If the organic prior art EL device 100 is to be constructed with a cathode of a material having a work function greater than 4.0 eV (such as, for example, an aluminum cathode, or a silver cathode), a thin alkali fluoride interfacial layer (not shown) can be interposed between such cathode and the organic electron-transporting layer 120 to provide effective electron injection, as disclosed by Hung et al. U.S. Pat. No. 5,776,622, the disclosure of which is herein incorporated by reference.

Turning to FIG. 2, a schematic cross section of an organic light-emitting device 200 differs from the construction of the prior art device 100 of FIG. 1 in that a highly absorbing and low reflection layer 230 is provided between the cathode 240 and the organic electron-transporting layer 220. The layer 230 substantially eliminates reflection of ambient-light 292 entering the device through the light-transmissive substrate 202 and the light-transmissive anode 204, as well as reflection of the emitted light 282 from the light-emitting junction 215 in a direction toward the layer 230. Light 286 is emitted from the device through the substrate 202. All other elements and their functions have been described with reference to FIG. 1. For example, the organic hole-transporting layer 210 corresponds to the organic hole-transporting layer 110 of FIG. 1, and leads 262 and 264 correspond to leads 162 and 164 in FIG. 1. Accordingly, a further description of those elements will not be required. Particularly useful material for forming the layer 230 are electrically conductive materials having a work function less than 4.0 eV, and being substantially black in bulk form. Such preferred materials include calcium hexaboride ($CaB_6$) and lanthanum nitride (LaN). The layer 230 can be formed by conventional thermal vapor deposition or by sputter-deposition over the organic electron-transporting layer 220 at a layer thickness in a preferred range from 20 to 200 nm.

Figure 4:
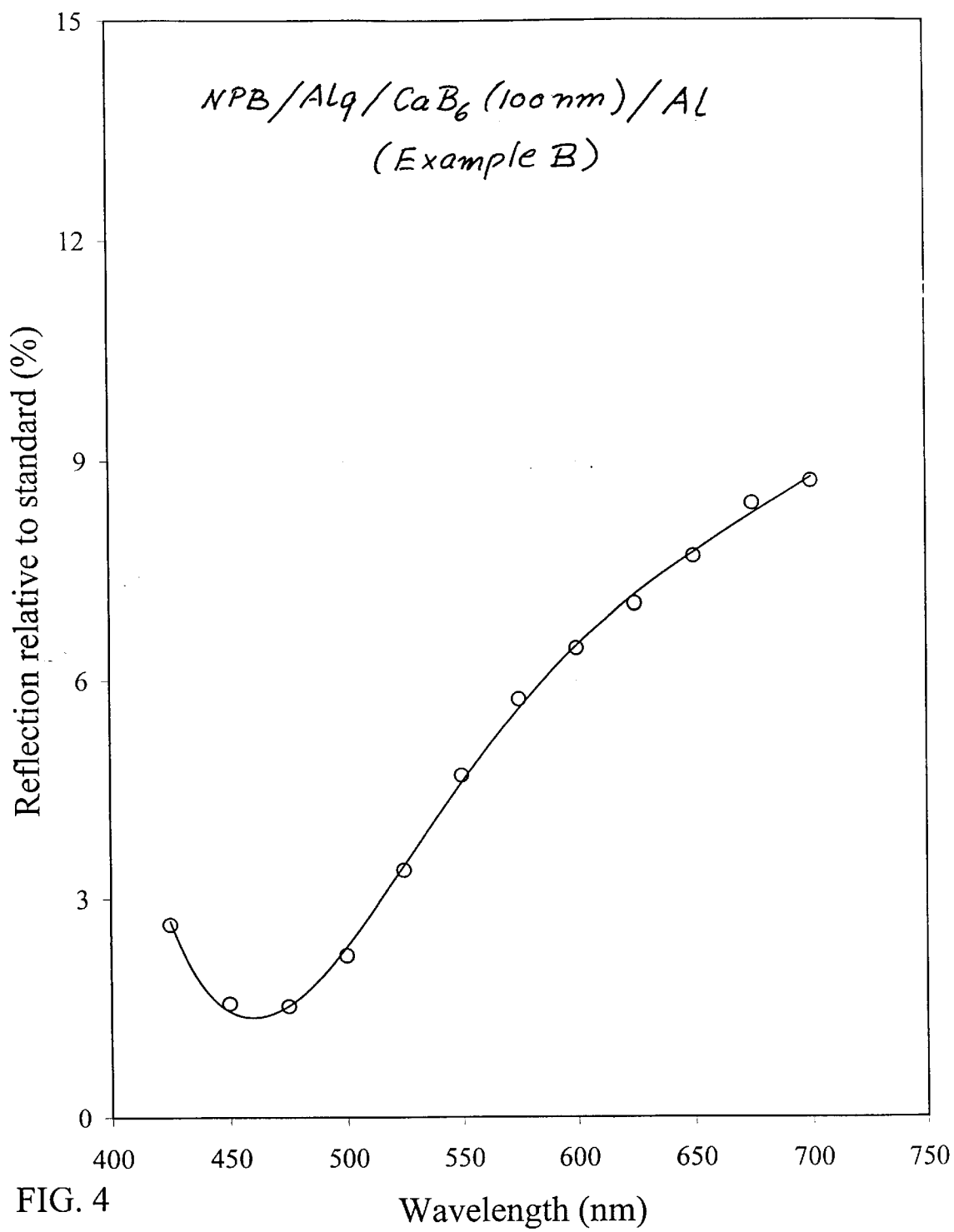
FIG. 4 shows in graphic form a spectral reflectance of an organic EL device having the reflection-reducing layer of the device of FIG. 2.

As will be become apparent from viewing FIG. 4 the reflection-reducing layer 230 of the device 200 is effective in reducing ambient-light reflection from the device, thereby enhancing the contrast in observing the emitted light 286 under ambient-light conditions.

Turning to FIG. 3, a schematic cross section of another embodiment of an organic light-emitting device 300 is shown having a reflection-reducing layer 350 with a surface 352 and a bi-layer interfacial structure 370 comprised of a thin alkali fluoride layer 372 in contact with the organic electron-transporting layer 320, and a thin aluminum layer 374 in contact with the reflection-reducing layer 350.

The organic hole-transporting layer 310, a light-emitting junction 315, an electron transporting layer 320, and leads 362 and 364 correspond to the organic hole-transporting layer 110, light-emitting junction 115, electron transporting layer 120, and leads 162 and 164 of the device of FIG. 1. Similarly, light 382 emitted toward the reflection-reducing layer 350 corresponds to light 182 of the device of FIG. 1.

In this embodiment the reflection-reducing layer 350 is formed of an n-type inorganic semiconductor material which has a work function greater than 4.0 eV, and an electron affinity greater than an electron affinity of the n-type organic semiconductor from which the electron-transporting layer 320 is constructed. Electrons are readily injected from the cathode 340 into the n-type inorganic semiconductor reflection-reducing layer 350, and the bi-layer interfacial structure 370 provides for effective electron injection from the layer 350 into the organic electron-transporting layer 320. The lack of this interfacial modification structure would impede electron transport from the layer 350 into the electron-transporting layer 320 because of an injection barrier at the interface of these layers.

Preferred materials for forming the reflection-reducing layer 350 include inorganic n-type semiconductor materials such as, for example, zinc oxide (ZnO) and zinc sulfide (ZnS), Zinc oxide, when formed by a conventional thermal vapor deposition, so as to be oxygen-deficient, can be optically absorbing and sufficiently electrically conductive to meet all requirements of an effective reflection-reducing layer in an organic light-emitting device, except for the work function requirement. However, as indicated above, the bi-layer interfacial structure 370, comprised of thin layers 372 and 374, provides for effective electron transport from the cathode 340 into the organic electron-transporting layer 320.

The reflection-reducing layer 350 is preferably constructed by conventional thermal vapor deposition or sputter-deposition to a thickness in a preferred range from 30 to 200 nm.

The bi-layer interfacial structure is preferably constructed from a thin alkali fluoride layer 372 having a preferred thickness in a range from 0.1 to 1.5 nm, and in contact with the organic electron-transporting layer 320, and a thin layer of aluminum 374 over the layer 372, formed by conventional thermal vapor deposition to a preferred thickness in a range from 0.1 to 2 nm and in contact with the reflection-reducing n-type semiconductor layer 350. Alkali fluorides useful in the practice of the invention include lithium fluoride, sodium fluoride, potassium fluoride, rubidium fluoride, and cesium fluoride. A particularly preferred alkali fluoride for forming the layer 372 of the bi-layer interfacial structure 370 is lithium fluoride.

As previously described with reference to the inventive device 200 of FIG. 2, the reflection-reducing layer 350 is effective in minimizing or eliminating ambient-light 392 entering the device through the light-transmissive substrate 302 and the light-transmissive anode 304, so as to provide light emission 386 having substantially enhanced contrast with respect to viewing under ambient-light conditions.

A detailed description of FIGS. 4–10 is given in Section II., Results.

EXAMPLES

The following examples are presented for a further understanding of the embodiments of the invention. For purposes of brevity, the materials and the layers formed therefrom will be abbreviated as given below:

ITO: indium tin oxide (light-transmissive anode);
NPB: 4,4'-bis-[1-naphthyl)-N-phenylamino]-bi-phenyl; used to form the hole-transporting layers
Alq: tris(8-quinolinato-N1,08)-aluminum, also known as aluminum trisoxine; used to form the electron-transporting layers
$CaB_6$ calcium hexaboride, used to form a highly absorbing and reflection-reducing layer
LiF: lithium fluoride; used to form one thin layer of a bi-layer interfacial structure
Al: aluminum; used to form a cathode, and to form another thin layer of a bi-layer interfacial structure
MgAg: magnesium:silver at a ratio of 10:1 by volume; used to form a cathode
ZnO zinc oxide, used to form a reflection-reducing layer I. Preparation of a base configuration of an organic light-emitting device A base configuration was constructed as follows:

a) a light-transmissive anode of ITO-coated glass was ultrasonicated in a commercial detergent, rinsed in deionized water, degreased in toluene vapor, and contacted by a strong oxidizing agent;

b) a 75 nm thick NPB hole-transporting layer was deposited over the ITO anode by conventional thermal vapor deposition; and c) a 75 nm thick Alq electron-transporting layer was deposited over the NPB layer by conventional thermal vapor deposition.

The above structure serves as a base configuration for each of the following examples, and is given in abbreviated form as NPB/Alq

Example A

A prior art organic light-emitting device was constructed as follows to serve as a "standard" device:

a MgAg cathode was deposited over the Alq layer of the base configuration by conventional thermal vapor co-deposition from two sources (Mg and Ag) to a thickness of about 200 nm, so as to provide a reflective surface of the cathode as viewed through the glass substrate in ambient-light. This prior art device is abbreviated as NPB/Alq/MgAg (FIGS. 6A and 7–10)

Example B

Figure 7:
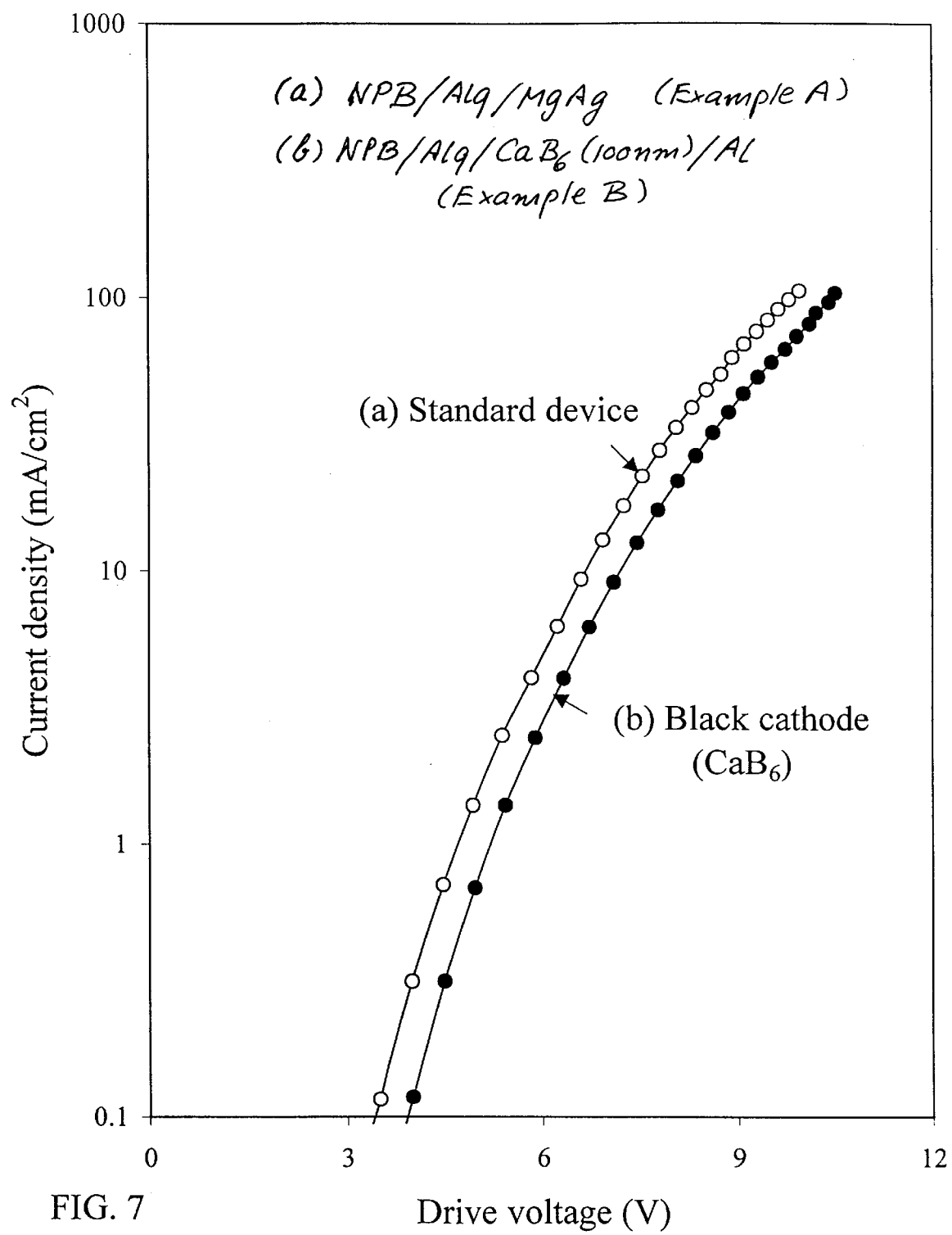
FIG. 7 shows in graphic form a current density-drive voltage relationship of a prior art organic EL device, and of an organic EL device having the reflection-reducing layer of the device of FIG. 2.
Figure 8:
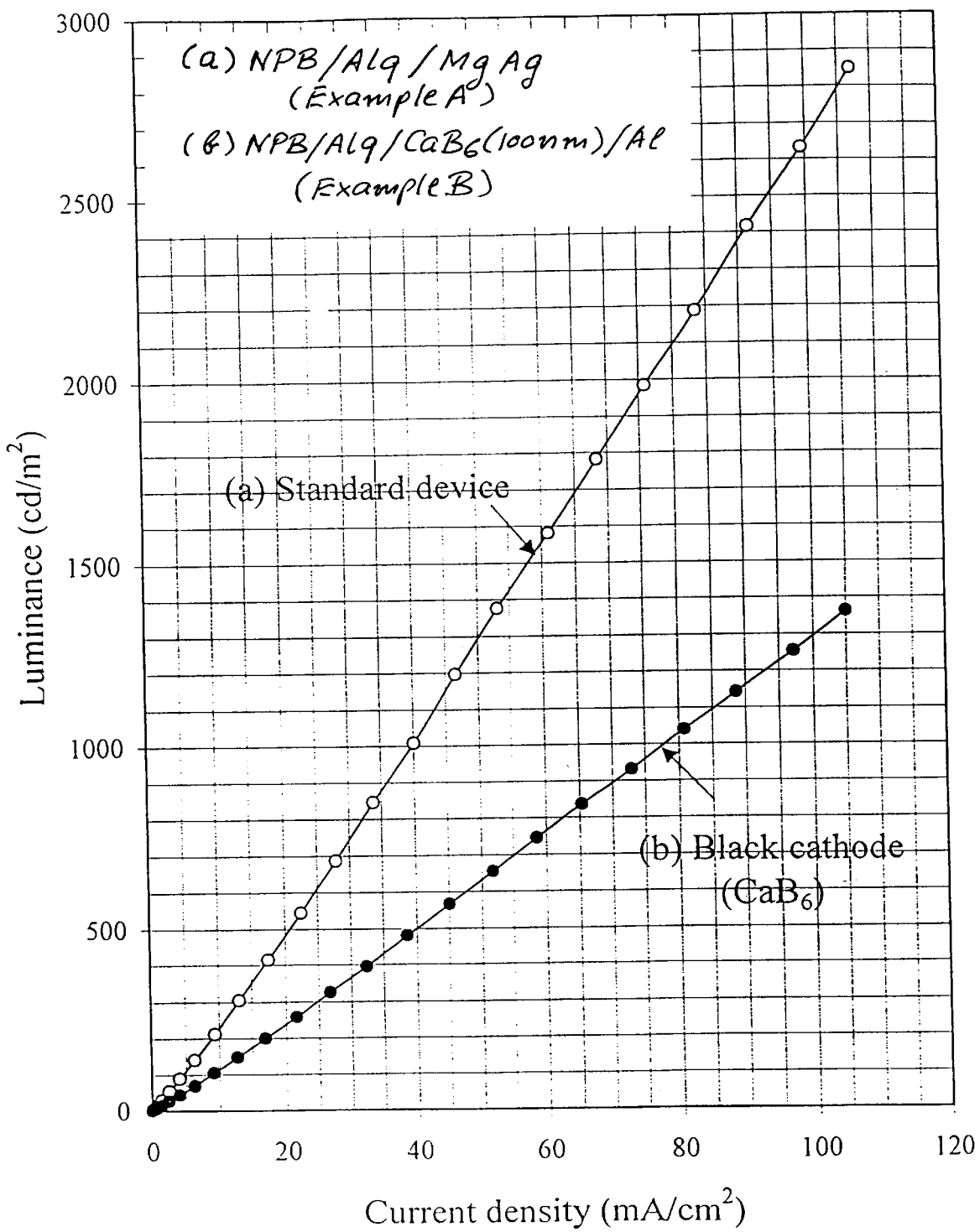
FIG. 8 shows in graphic form a luminance-current density relationship of a prior art "standard" organic EL device, and of an organic EL device having the reflection-reducing layer of the device of FIG. 2.

One embodiment of a reduced ambient-light-reflection organic light-emitting device was constructed as follows:

a 100 nm thick $CaB_6$ layer was deposited over the Alq layer of the base configuration by conventional thermal vapor deposition, and a 100 nm thick Al cathode was deposited over the $CaB_6$ layer. This embodiment of the device is abbreviated as NPB/Alq/$CaB_6$(100 nm)/Al (FIGS. 4, 7 and 8)

Example C

Another embodiment of a reduced ambient-light-reflection organic light-emitting device was constructed as follows:

a bi-layer interfacial structure was formed over the Alq layer of the base configuration in the following manner:

a 0.3 nm thick LiF layer was deposited over the Alq layer by conventional thermal vapor deposition, and a 0.6 nm thick Al layer was formed over the LiF layer by conventional thermal vapor deposition;

a 85 nm thick ZnO reflection-reducing layer was deposited over the Al layer of the interfacial structure by conventional thermal vapor deposition, so as to provide an oxygen-deficient ($ZnO_{1-x}$) n-type semiconductor layer, and a 100 nm thick Al cathode was deposited over the $ZnO_{1-x}$ layer. This embodiment of the device is abbreviated as NPB/Alq/LiF/Al/ZnO(85 nm)/Al (FIGS. 5, 6B, 9, and 10)

II. Results

FIG. 4 shows in graphic form a measured relationship between reflectance (reflection beam intensity) and wavelength of an incident light beam used in a reflectance spectrophotometer. The reflectance trace of the inventive device of FIG. 2 having a $CaB_6$ reflection-reducing layer 230 (Example B) is plotted relative to the reflectance trace of the prior art "standard" device of FIG. 1 (Example A). The reflectance of the inventive device is reduced to less than 10% over a wavelength range from about 410 nm to 700 nm.

Figure 5:
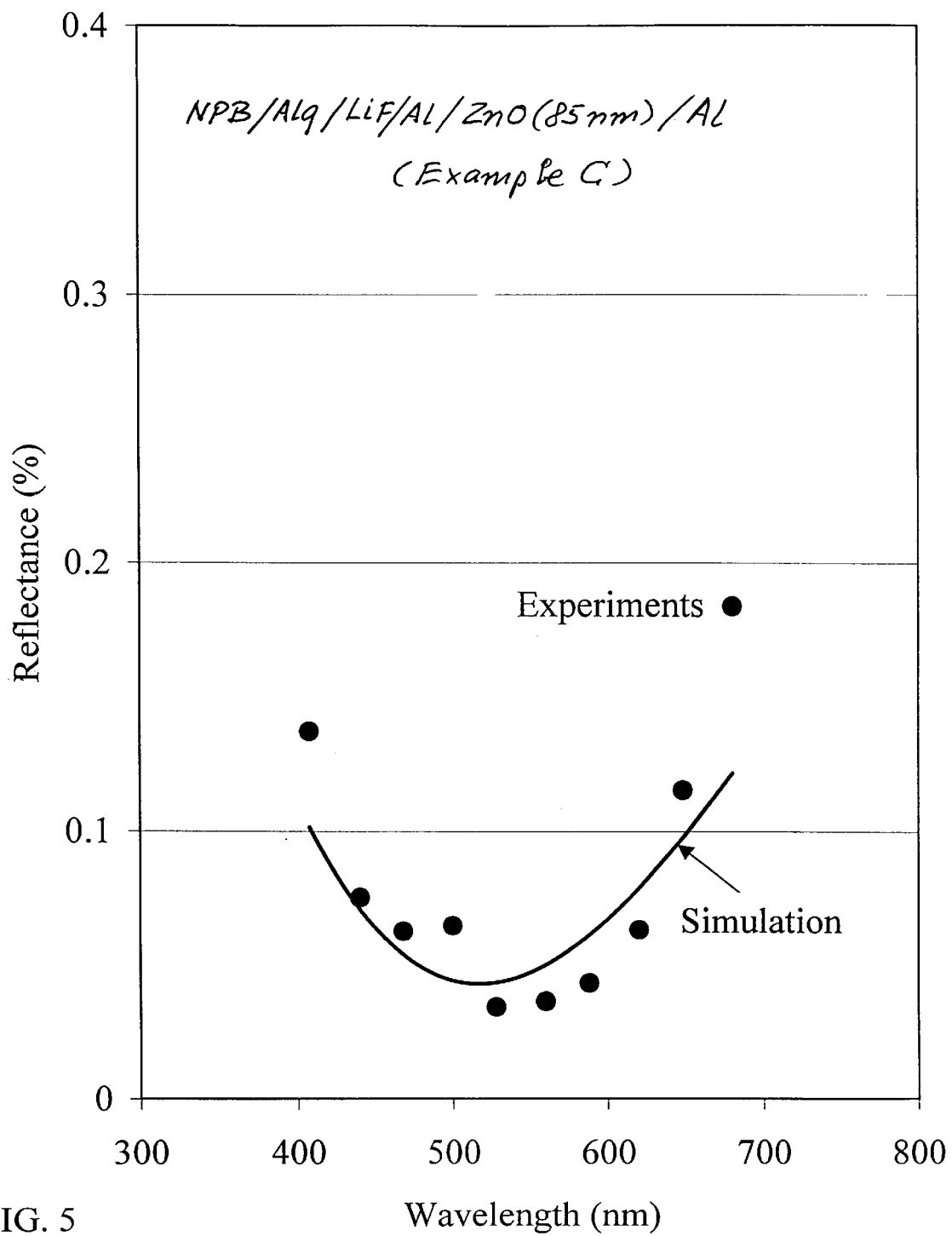
FIG. 5 shows in graphic form a spectral reflectance of an organic EL device having the reflection-reducing layer of the device of FIG. 3.

FIG. 5 shows in graphic form a measured relationship between reflectance (reflection beam intensity) and wavelength of an incident light beam used in a reflectance spectrophotometer. The reflectance trace of the inventive device of FIG. 3 having a $ZnO_{1-x}$ reflection-reducing layer (Example C) is plotted relative to the reflectance trace of the prior art "standard" device of FIG. 1 (Example A). The reflectance of the inventive device is reduced to less than 20% at wavelengths of about 410 nm and 690 mn, and to less than about 10% at intermediate wavelengths with respect to the reflectance levels of the prior art device.

Figure 6A:
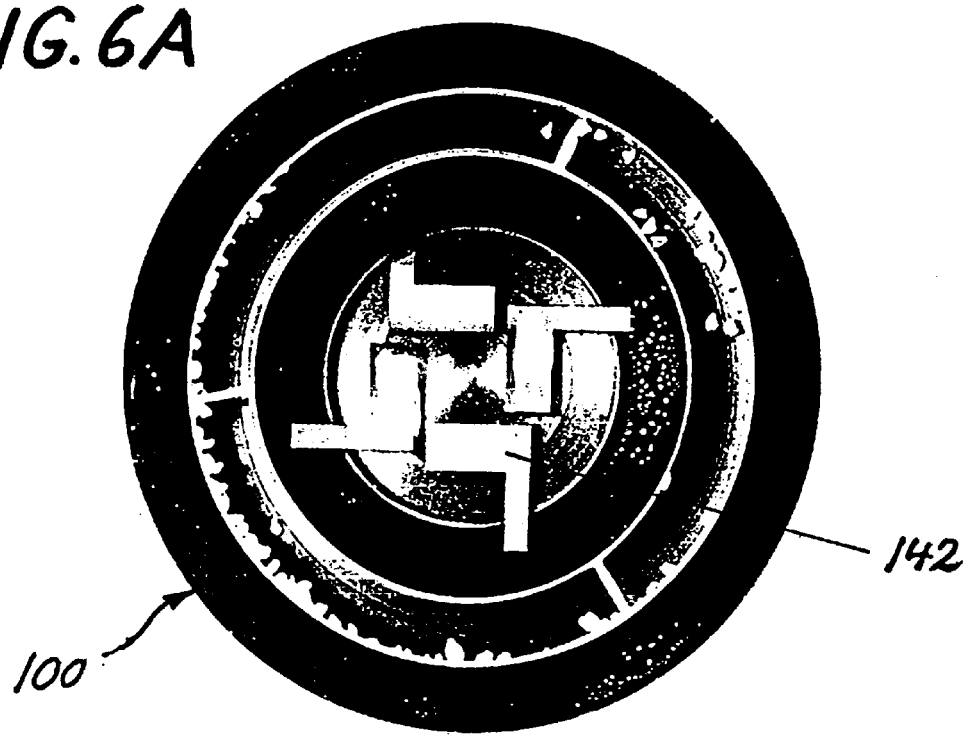
FIG. 6A is a photographic rendition of a prior art organic light-emitting device having a reflective cathode surface.

FIG. 6A is a photographic rendition of the prior art organic light-emitting device 100 of FIG. 1 which has the reflective cathode surface 142 (Example A). This device was photographed under fluorescent room light conditions and by using a flash attachment with the camera. Four highly reflective cathodes are shown.

Figure 6B:
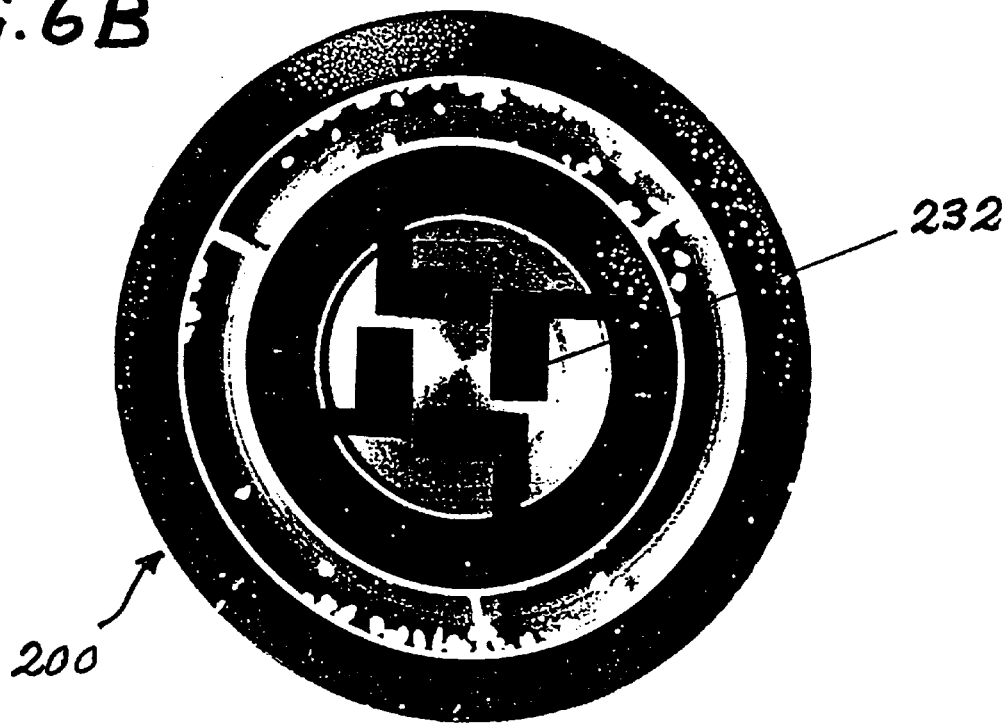
FIG. 6B is a photographic rendition of an organic light-emitting device having the reflection-reducing layer of the device of FIG. 3.

FIG. 6B is a photographic rendition of a reduced ambient-light reflection organic light-emitting device 300 of FIG. 3 which has a $ZnO_{1-x}$ reflection-reducing layer 350 (Example C). This device was photographed as described above. Four low-reflectance "black" cathodes demonstrate the effectiveness of the reflection-reducing layer 350 in reducing ambient-light reflection (fluorescent room lights plus flash) from these cathodes.

FIG. 7 shows in graphic form a relationship between current density and applied drive voltage for a prior art "standard" device (Example A) and for the reduced-reflection device having the $CaB_6$ reflection-reducing layer (Example B).

FIG. 8 shows in graphic form a relationship between luminance (of emitted light) and current density for a prior art device (Example A) and for the reduced-reflection device having the $CaB_6$ reflection-reducing layer (Example B). The luminance of the reduced-reflection device reaches approximately 50% of the luminance of the prior art device at a selected current density. Such luminance reduction is attributed to the effectiveness of the $CaB_6$ reflection-reducing layer since light emission from the junction 215 (see FIG. 2) in a direction (282) toward the cathode is not reflected from the surface 232 of the reflection-reducing layer 230, whereas a prior art device (see FIG. 1) reflects from the cathode surface 142 substantially all of the light (184) which is emitted in a direction (182) toward the cathode. This reflected light (184) contributes substantially to the light (180) emitted through the substrate.

Figure 9:
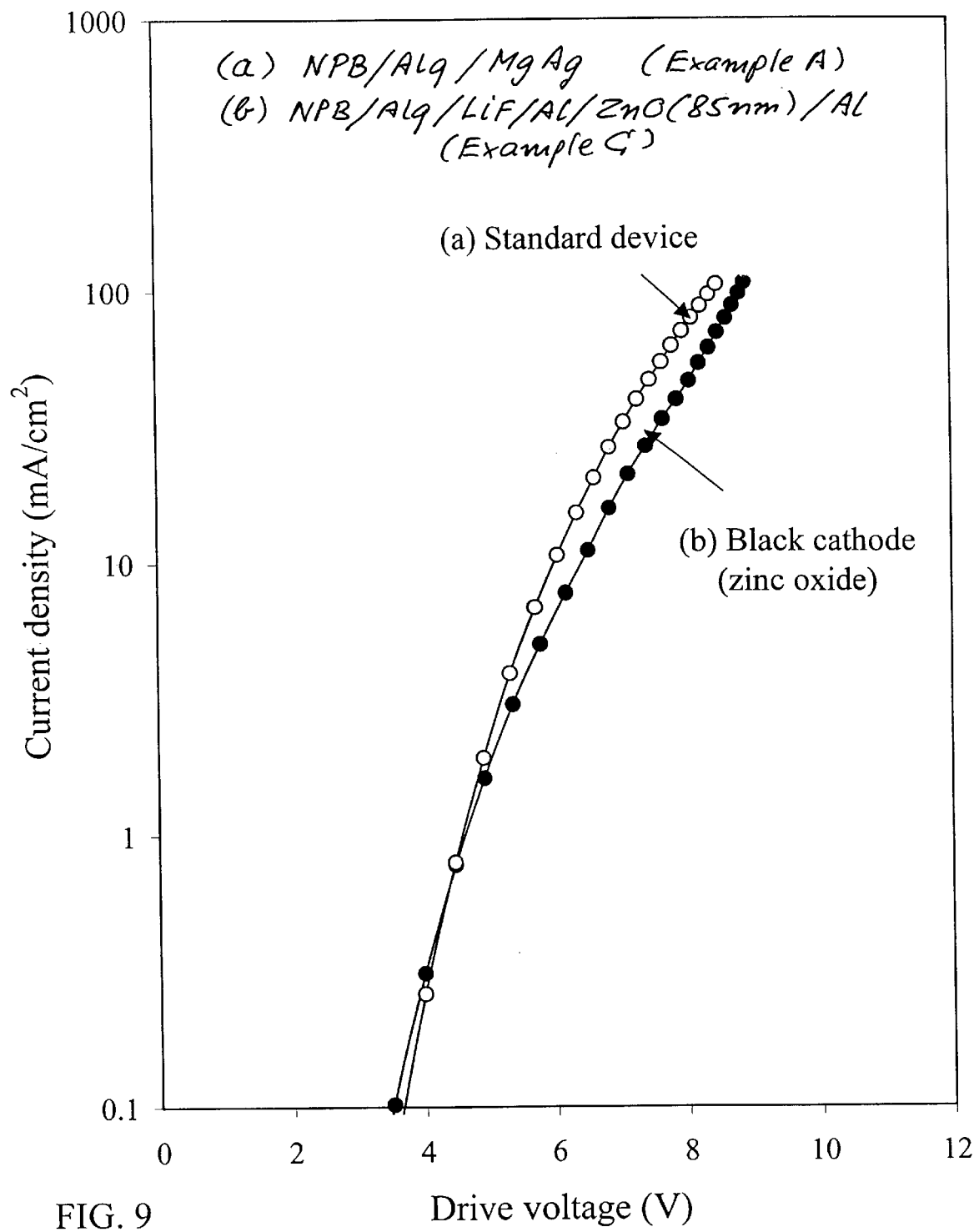
FIG. 9 shows in graphic form a current density-drive voltage relationship of a prior art organic EL device, and of an organic EL device having the reflection-reducing layer and the bi-layer interfacial structure of the device of FIG. 3.

FIG. 9 shows in graphic form a relationship between current density and applied drive voltage for a "standard" device having a reflective MgAg cathode surface (Example A) and for a reduced-reflection device having a $ZnO_{1-x}$ reflection-reducing layer (Example C).

Figure 10:
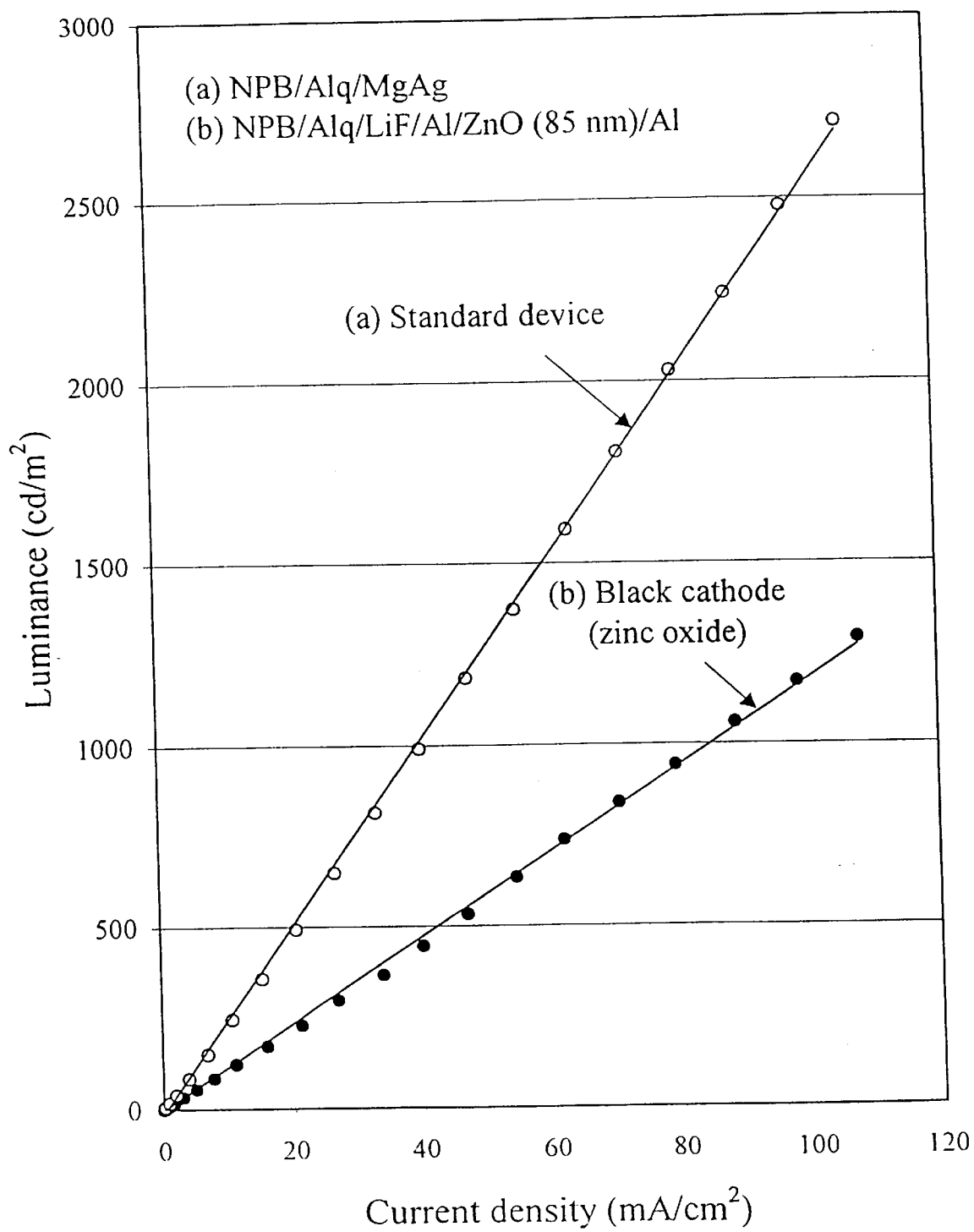
FIG. 10 shows in graphic form a luminance-current density relationship of a prior art "standard" organic EL device, and of an organic EL device having the reflection-reducing layer and the bi-layer interfacial structure of the device of FIG. 3.

FIG. 10 shows in graphic form a luminance-current density relationship for the "standard" device (Example A) and for the reduced-reflectance device having the $ZnO_{1-x}$ reflection-reducing layer and the LiF/Al bi-layer interfacial structure (see FIG. 3) of Example C. The luminance achieved at a selected current density is slightly less than 50% for the reduced-reflectance device compared to the "standard" device. However, the ZnO reflection-reducing layer, in conjunction with the LiF/Al bi-layer interfacial structure, provides a substantially enhanced contrast for viewing light emitted from this embodiment under ambient light conditions ranging from ambient fluorescent lighting to higher intensity ambient lighting.

Viewing FIGS. 4–10 together, it will be appreciated that the inventive devices provide a substantially enhanced contrast for viewing light emitted from these embodiments of reduced ambient-light reflectance organic light-emitting devices under ambient-light conditions ranging from ambient fluorescent lighting to higher intensity ambient lighting.

The invention has been described in detail with particular reference to certain preferred embodiments thereof, but it will be understood that variations and modifications can be effected within the spirit and scope of the invention.

PARTS LIST 100 organic light-emitting device (PRIOR ART)
102 light-transmissive substrate
104 light-transmissive hole-injecting anode
110 organic hole-transporting layer
105 light-emitting junction
120 organic electron-transporting layer
140 cathode
142 surface of cathode
160 drive voltage source
162 lead
164 lead
180 light emitted through substrate
182 light emitted toward cathode
184 emitted light reflected from cathode surface
192 ambient-light entering device
194 ambient-light reflected from cathode surface
200 reduced ambient-light-reflection organic light-emitting device
202 light-transmissive substrate
204 light-transmissive anode
210 organic hole-transporting layer
215 light-emitting junction
220 organic electron-transporting layer
230 reflection-reducing layer
232 surface of reflection-reducing layer
240 cathode
260 drive voltage source
262 lead PARTS LIST (con't)

264 lead
282 light emitted toward reflection-reducing layer
286 light emitted through substrate
292 ambient-light entering device
300 reduced ambient-light-reflection organic light-emitting device
302 light-transmissive substrate
304 light-transmissive anode
310 organic hole-transporting layer
315 light-emitting junction
320 organic electron-transporting layer
340 cathode
350 reflection-reducing layer
352 surface of reflection-reducing layer
360 drive voltage source
362 lead
364 lead
370 bi-layer interfacial structure
372 thin alkali fluoride layer
374 thin aluminum layer
382 light emitted toward reflection-reducing layer
386 light emitted through substrate
392 ambient-light entering device

What is claimed is:

1. An organic light-emitting device having reduced ambient-light reflection from a cathode, comprising:
   a) a light-transmissive substrate;
   b) a light-transmissive anode disposed over the substrate;
   c) an organic hole-transporting layer disposed over the anode;
   d) an organic electron-transporting layer disposed over the hole-transporting layer, an interface between the electron-transporting layer and the hole-transporting layer forming a junction capable of emitting light when the device is operative;
   e) a bi-layer interfacial structure disposed over the electron-transporting layer, the bi-layer interfacial structure capable of providing electron injection into the electron-transporting layer;
   f) a reflection-reducing layer disposed over the bi-layer interfacial structure, the reflection-reducing layer formed of an n-type semiconductor material having a work function greater than 4.0 eV, the reflection-reducing layer substantially reducing reflection of ambient-light entering the device through the substrate and the anode; and
   g) a cathode disposed over the reflection-reducing layer, the cathode formed of a light-reflecting metal material.

2. The organic light-emitting device of claim 1 wherein the reflection-reducing layer is formed of an n-type semiconductor material selected from the group consisting of zinc oxide (ZnO) and zinc sulfide (ZnS).

3. The organic light-emitting device of claim 2 wherein the reflection-reducing layer is formed of a selected material at a thickness in a range of from 30 to 200 nm.

4. The organic light-emitting device of claim 1 wherein the bi-layer interfacial structure includes a thin layer of an alkali fluoride in contact with the organic electron-transporting layer and a thin aluminum layer formed over the alkali fluoride layer and in contact with the reflection-reducing layer.

5. The organic light-emitting device of claim 4 wherein the alkali fluoride layer includes one of lithium fluoride, sodium fluoride, potassium fluoride, rubidium fluoride, and cesium fluoride.

6. The organic light-emitting device of claim 4 wherein the alkali fluoride layer includes lithium fluoride.

7. The organic light-emitting device of claim 4 wherein the thin alkali fluoride layer has a thickness in a range of from 0.1 to 1.5 nm, and the thin aluminum layer has a thickness in a range of from 0.1 to 2.0 nm.

8. The organic light-emitting device of claim 1 wherein the cathode is optically reflective and capable of injecting electrons into the reflection-reducing layer.

* * * * *